United States Patent
Uvais et al.

(10) Patent No.: US 11,049,728 B2
(45) Date of Patent: Jun. 29, 2021

(54) BORON-DOPED AMORPHOUS CARBON HARD MASK AND RELATED METHODS

(71) Applicant: ENTEGRIS, INC., Billerica, MA (US)

(72) Inventors: Ajith Uvais, Kamakura (JP); Steve E. Bishop, Corrales, NM (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/657,023

(22) Filed: Oct. 18, 2019

(65) Prior Publication Data

US 2020/0135485 A1 Apr. 30, 2020

Related U.S. Application Data

(60) Provisional application No. 62/753,345, filed on Oct. 31, 2018.

(51) Int. Cl.
| | |
|---|---|
| *H01L 21/308* | (2006.01) |
| *H01L 21/02* | (2006.01) |
| *H01L 21/3065* | (2006.01) |
| *H01L 21/469* | (2006.01) |

(52) U.S. Cl.
CPC .... *H01L 21/3086* (2013.01); *H01L 21/02115* (2013.01); *H01L 21/3065* (2013.01); *H01L 21/3081* (2013.01); *H01L 21/469* (2013.01)

(58) Field of Classification Search
None
See application file for complete search history.

(56) References Cited

U.S. PATENT DOCUMENTS

| | | |
|---|---|---|
| 2,787,564 A | 4/1957 | Shockley |
| 8,237,134 B2 | 8/2012 | Robert |
| 9,018,066 B2 | 4/2015 | Wu |
| 9,209,280 B2 | 12/2015 | Tsai |
| 9,287,124 B2 | 3/2016 | Kong |
| 9,299,581 B2 | 3/2016 | Lee |
| 9,859,402 B2 | 1/2018 | Hung |
| 9,934,982 B2 | 4/2018 | Prasad |
| 2004/0087155 A1 | 5/2004 | Wieczorek |
| 2007/0032054 A1* | 2/2007 | Ramaswamy ...... H01L 21/0332 438/513 |
| 2009/0087968 A1 | 4/2009 | Jung |
| 2011/0287633 A1 | 11/2011 | Lee |
| 2013/0302996 A1 | 11/2013 | Reilly |
| 2015/0064914 A1* | 3/2015 | Kong .................. H01L 21/0332 438/696 |
| 2015/0194317 A1 | 7/2015 | Manna |
| 2018/0076049 A1* | 3/2018 | Lee .......................... C23C 16/52 |
| 2018/0182636 A1 | 6/2018 | Prasad |
| 2019/0172714 A1* | 6/2019 | Bobek .................. C23C 16/505 |

FOREIGN PATENT DOCUMENTS

| | | |
|---|---|---|
| TW | 201517133 A | 5/2015 |
| TW | 201623147 A | 7/2016 |

* cited by examiner

*Primary Examiner* — Asok K Sarkar
(74) *Attorney, Agent, or Firm* — Entegris, Inc.

(57) ABSTRACT

Described are boron-doped amorphous carbon hard masks, methods of preparing boron-doped amorphous carbon hard masks, methods of using the boron-doped amorphous carbon hard masks, and devices that include the boron-doped amorphous carbon hard masks.

14 Claims, 4 Drawing Sheets

BORON-DOPED AMORPHOUS CARBON HARD MASK AND RELATED METHODS

FIELD

The following disclosure relates to boron-doped amorphous carbon hard masks, methods of preparing boron-doped amorphous carbon hard masks, methods of using the boron-doped amorphous carbon hard masks during an etching step, and devices (microelectronic device substrates) that include the boron-doped amorphous carbon hard masks.

BACKGROUND

Processing semiconductor and microelectronic devices involves various steps of depositing layers of materials and removing materials by chemical processes referred to as "etching." By etching, a thin mask layer is placed over a layer of deposited material. Openings are then formed in the mask and select portions of the substrate are exposed. The masked substrate is then contacted with an etchant, which contacts material of the underlying substrate through the openings in the mask and chemically degrades and removes the material of the substrate to form openings (three-dimensional spaces) in the substrate.

Many newer types of substrates, such as those used to prepare three-dimensional memory devices, are processed to form openings that have a high aspect ratio, e.g., openings that have a depth extending into a substrate that is significantly greater than a width dimension (e.g., diameter) of the opening. As one example, vertically-extending "channel holes" of a 3D NAND memory device are formed by etching a vertically-extending opening in a depth direction into a stack of many layers of deposited films. The depth of the channel hole may be twenty, forty, or fifty times greater than a diameter of the channel hole, or more. Forming this type of high aspect ratio feature in a microelectronic device by etching requires highly specialized, accurate, and precise etching processes.

For this type of etching step, a chemical resistant "hardmask" is placed over the top layer of the multiple layers of deposited films. The film layers, sometimes referred to as a "film stack," are functional materials of the memory device and may be layers of deposited silicon oxide, silicon nitride, polysilicon, or the like. The hardmask is resistant to an etching solution that is used to chemically degrade and remove materials of the film stack to form the high aspect ratio opening in the substrate (e.g., channel hole).

One common type of hardmask is an amorphous carbon hardmask. This type of hardmask is deposited onto a microelectronic device substrate as a continuous layer and is then etched to form openings in the hardmask. A subsequent step of etching the underlying substrate is then performed by exposing the substrate with the hardmask to a gaseous chemical etchant capable of chemically degrading a material of the film stack. The gaseous etchant passes through the openings in the hardmask to contact and etch away, i.e., remove, material of the substrate to produce an opening in the substrate. After the substrate material has been etched away as desired, the hardmask must be removed from the substrate to allow the substrate to be further processed to a finished microelectronic device.

SUMMARY

Producing precisely-formed and well-defined substrate openings that exhibit a high aspect ratio can be very challenging. One component of etching processes that is often studied for improving the overall process is the hardmask, including the composition of the hardmask and methods of applying and removing the hardmask. Past research relating to hardmasks has involved doping an amorphous carbon hardmask with boron to increase the resistance of the hardmask to chemical etchants.

One aspect of the invention includes a method for forming an amorphous carbon layer on a microelectronic device substrate, etching the amorphous carbon layer to form openings in the amorphous carbon layer, and then doping the etched amorphous carbon layer with boron to form a boron-doped amorphous carbon hardmask. The doping step is performed using an ion beam implantation method. The boron-doped amorphous carbon hardmask layer is annealed (either during or after the boron-doping step) to improve the chemical resistance of the hardmask.

A second aspect of the invention includes a method for forming an amorphous carbon layer on a microelectronic device substrate, patterning at least a portion of the amorphous carbon layer with a mask, doping the amorphous carbon layer with boron to form a boron-doped amorphous carbon hardmask, etching the amorphous carbon hardmask to form openings in the amorphous carbon layer. The doping step is performed using an ion beam implantation method. The boron-doped amorphous carbon hardmask layer is annealed (either during or after the boron-doping step) to improve the chemical resistance of the hardmask.

In another aspect of the invention the amorphous carbon hardmask by ion beam implantation produces a layer of boron-doped amorphous carbon hardmask that includes a higher concentration of boron at a top (upper) portion of the hardmask layer, and a lower concentration of boron a bottom (lower) portion of the hardmask layer. This concentration gradient of the boron in the hardmask layer can be particularly useful. The high concentration of boron at the upper portion of the hardmask layer increases the chemical resistance of the hardmask at the upper portion, where the hardmask requires increased chemical resistance during an etching step. An increased chemical resistance of the upper portion of the hardmask layer can allow for the boron-doped amorphous carbon hardmask to be useful as a hardmask for an etching step that uses a more strongly aggressive chemical etchant, or for an etching step that must be performed over a relatively longer period of time as compared to a comparable etching step, e.g., to produce a substrate opening such as a channel hole having a relatively increased depth and a relatively higher aspect ratio. Alternately or in addition, the increased chemical resistance of the upper layer of the hardmask may allow for a reduced thickness of the boron-doped amorphous carbon hardmask for performing an etching step with an etchant of equal strength and for an equal amount of time for performing the etching step.

While the upper portion of the hardmask contains boron to increase chemical resistance to the etchant of an etching step, the lower portion of the hardmask layer does not require a significantly increased chemical resistance. The lower portion can contain a lower concentration of boron as a dopant. With the lower concentration of boron, the lower portion can be more easily removed after the hardmask is used during an etching step.

In another aspect of the invention the amorphous carbon hardmask by ion beam implantation produces a layer of boron-doped amorphous carbon hardmask that includes a more conformed concentration level of boron throughout the carbon hardmask.

In one aspect, the invention relates to a method of preparing a microelectronic device substrate. The method includes: implanting boron by ion implantation into an amorphous carbon layer of a substrate that comprises one or more layers of a microelectronic device and the amorphous carbon hardmask layer at a top surface; and annealing the amorphous carbon hardmask layer.

In another aspect, the invention relates to a microelectronic device substrate. The substrate includes: one or more layers of a microelectronic device; and on an upper surface of the one or more layers, a boron-doped hardmask layer comprising a first surface contacting the upper surface of the microelectronic device, an exposed surface, a thickness between the first surface and the exposed surface, and openings extending through the thickness. The boron-doped hardmask layer includes amorphous carbon and implanted boron, with the boron being present at a relatively higher concentration at an upper portion of a thickness of the amorphous carbon hardmask layer and at a relatively lower concentration at a lower portion of the thickness, and the boron-doped hardmask layer being annealed.

Figure 1:
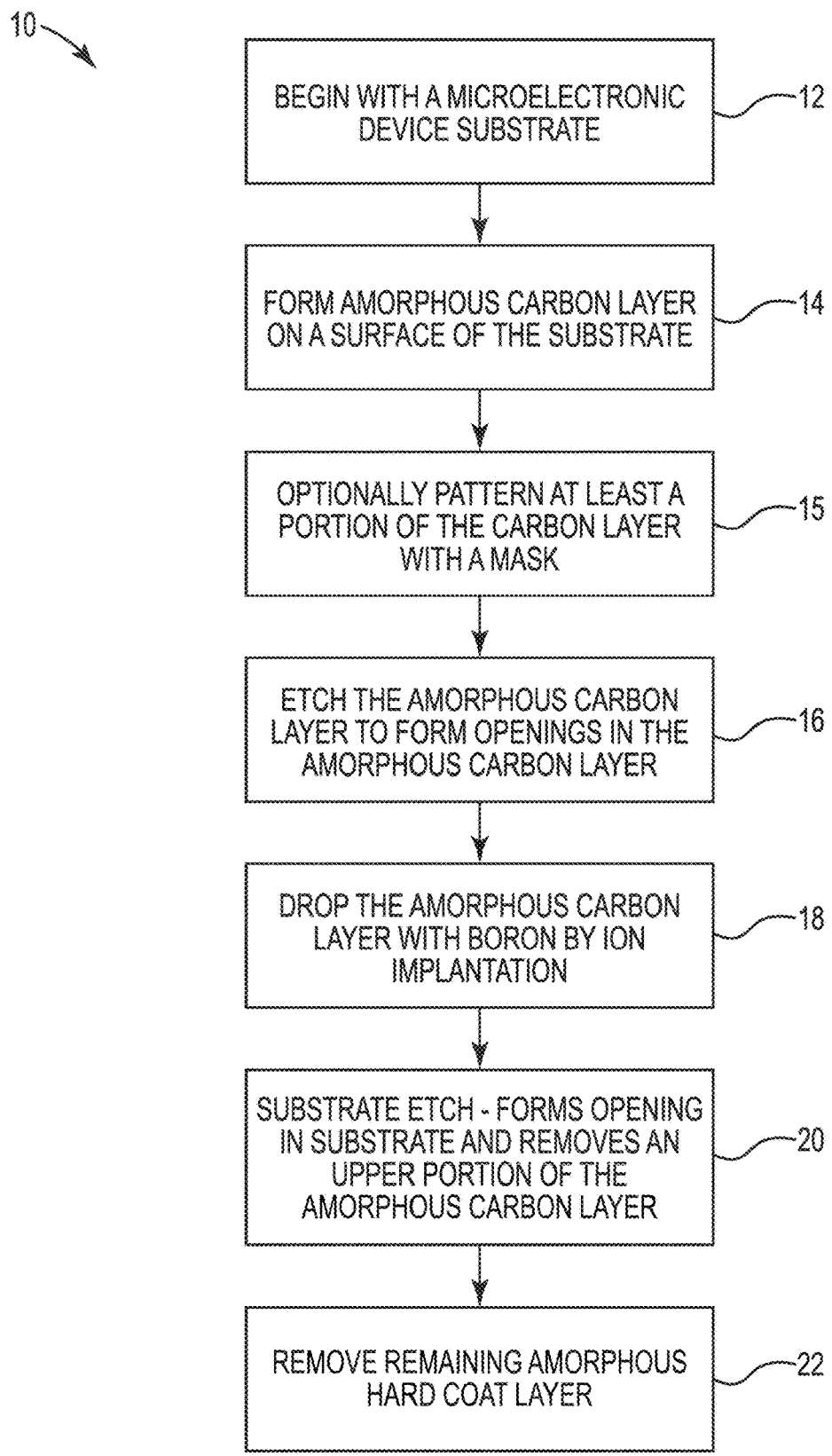
FIG. 1 shows an example of a method as described for forming and using a boron-doped carbon hardmask.

The drawings are schematic and are not to scale.

DETAILED DESCRIPTION

The present disclosure discloses methods and processes for forming a boron-doped amorphous carbon hardmask. The methods include forming an amorphous carbon layer on a microelectronic device substrate, etching the amorphous carbon layer to form openings in the amorphous carbon layer, and then doping the etched amorphous carbon layer with boron to form a boron-doped amorphous carbon hardmask. The doping step is performed using an ion beam implantation method. The boron-doped amorphous carbon hardmask is annealed to improve the chemical resistance of the hardmask.

The following description also describes multi-layer structures (e.g., microelectronic devices, especially in-process microelectronic devices) that include an annealed, boron-doped amorphous hardmask as described, and methods of using an annealed, boron-doped amorphous carbon hardmask in processing a microelectronic device.

A boron-doped hardmask (sometimes referred to herein as simply a "hardmask," "boron-doped hardmask," etc.) as described can be formed by first forming an amorphous carbon layer on a surface of a microelectronic device. This amorphous carbon layer can be and is preferably non-boron-doped when applied. The amorphous carbon layer is then etched to form holes in the carbon layer, resulting in an etched and preferably-non-boron-doped amorphous hardmask layer placed at a surface of the substrate. After the etching step, the etched amorphous hardmask layer is then doped with boron by an ion beam implantation method to form a boron-doped amorphous carbon hardmask layer. Either during or following the step of doping the amorphous carbon layer with boron, the boron-doped hardmask is annealed.

In one aspect of the invention, the boron dopant can be added to the amorphous carbon layer by an ion beam implantation method in a manner that produces a higher concentration of boron at and near the surface of the layer (i.e., at an "upper" portion or a "surface" portion), compared to the concentration of boron that is present at lower portions of the amorphous carbon layer. The ion implantation doping step can be controlled to cause a difference in the concentration of boron (e.g., a concentration gradient) along the direction of the depth or "thickness" of the amorphous carbon layer. As desired, the boron-dopant-containing amorphous carbon layer can be produced to contain a higher concentration of boron at the upper portion of the amorphous carbon layer, with the concentration of boron decreasing (e.g., gradually or otherwise) by location in the direction of the depth of the layer. The lower portion or the bottom of the amorphous carbon layer may contain a very low amount of boron or substantially no boron.

The reason that this concentration gradient is useful and advantageous is that the boron dopant increases the chemical resistance of the hardmask at the upper portion, where the hardmask requires increased chemical resistance, but does not increase chemical resistance of the hardmask at the lower portion, where increased chemical resistance is not needed and in fact, would cause the hardmask to be more difficult to remove from the substrate after the hardmask has served its purpose during a substrate etch step.

A higher concentration of boron present at the upper portion of the amorphous carbon layer advantageously allows for improved functionality during use of the boron-doped hardmask in a step of etching a microelectronic device substrate that includes the boron-doped hardmask. In specific, during an etching step that involves the hardmask, one or more etchants will be used to remove material from selected portions of the substrate, which are exposed through holes in the hardmask. During etching, however, the etchant also has a chemical effect on the surface of the hardmask itself, causing some amount of removal of material from the surface of the hardmask. During an etching process that forms a completed etched opening in a substrate, such as a channel hole having a high aspect ratio, a significant amount of the upper portion of the hardmask layer will be removed by the etchant. During this substrate etch step, the boron dopant at the upper portion of the hardmask layer will increase the resistance of the upper portion of the hardmask to the chemical etchant. Still, some of the boron-doped upper portion of the hardmask will be gradually removed during the substrate etch step, and by the end of the step the lower portion of the hardmask will remain as the exposed surface of the hardmask. This lower portion of the hardmask layer will contain a relatively lower concentration of boron dopant compared to the upper portion. The relatively lower concentration of boron in the lower portion will not unduly increase the difficulty of removing the remaining amount of the hardmask after the substrate etch step is completed.

Accordingly, as presented, the annealed boron-doped hardmask of the present description, particularly the boron-doped upper portion of the hardmask layer, exhibits increased chemical resistance to etchants during a substrate etch step. During a substrate etch step this boron-doped upper portion of the hardmask layer exhibits high resistance to an etchant and protects the underlying substrate surface from the etchant. Also during the substrate etch step, the exposed top surface of the hardmask layer is gradually chemically eroded by the etchant, and material of the upper portion of the hardmask layer is gradually removed.

After completing the substrate etch step, a lower portion of the original hardmask layer remains and is present at the exposed surface. This lower portion of the hardmask layer contains a relatively lower amount of boron dopant compared to the upper portion that was important to provide etch resistance during the substrate etch step. This lower portion of the hardmask must be removed following the substrate etch step to allow continued processing of the substrate. Because the lower portion contains a lower amount of boron dopant, the lower portion can be more easily removed when removal of the hardmask layer is required.

Preferably, the remaining (lower) portion of hardmask may be removed by one of various etching techniques that are known to be useful for etching or removing a layer of non-boron-doped amorphous carbon. Examples include oxygen-based etching techniques, including those that are described in greater detail below.

In another embodiment of the invention the boron is doped into the carbon amorphous layer so that the boron doped in the carbon hardmask is conformed throughout the carbon amorphous layer. For example, using described methods for doping the boron will result in a substantially conformed amount of boron dopant in the top and lower portion of the carbon amorphous layer.

A second aspect of the invention includes a method for forming an amorphous carbon layer on a microelectronic device substrate, patterning on at least a portion of the amorphous carbon layer, doping the amorphous carbon layer with boron to form a boron-doped amorphous carbon hardmask, etching the amorphous carbon hardmask to form openings in the amorphous carbon layer. The doping step is performed using an ion beam implantation method. The boron-doped amorphous carbon hardmask layer is annealed (either during or after the boron-doping step) to improve the chemical resistance of the hardmask.

For comparison, certain other boron-doped hardmask layers contain boron dopant throughout an entire thickness of a hardmask layer. In these hardmasks, the lower portion of the hardmask that remains on the substrate at the end of a substrate etch step, and that must be removed by further etching after the substrate etch step, can contain an amount of boron substantially increases the level of chemical resistance of the hardmask layer. To remove this type of a remaining boron-doped hardmask layer, highly aggressive etching technique are often used, as opposed to a typical oxygen-based etching technique that can be useful for removing a non-boron-doped amorphous carbon layer. For example, to remove a remaining lower portion of a hardmask that includes a more than insubstantial amount of boron as a dopant, certain techniques that may be used include modified oxygen plasma techniques that use oxygen as an etchant but that also require one or more additional, more highly aggressive, etchant material such as $CF_4$, $H_2$ or another more highly aggressive etching agent, or even a substantially different and specially-designed etching step that may use both chemical and non-chemical (e.g., mechanical) removal techniques.

The described boron-doped hardmask can be used for preparing a microelectronic device substrate by functioning as a hardmask during a step of forming an opening in the substrate by etching the substrate to remove material of the substrate to form the opening. The microelectronic device substrate (or "substrate" for short) can relate to any type of microelectronic device, including an "in-process" (or "precursor") device, meaning a device that includes structures, materials, and features of a finished microelectronic device but that is incomplete and still in the process of being fabricated. The microelectronic device may be one that provides a memory function or one that provides a logic function. Particular examples of microelectronic device substrates with which the described hardmask will be useful include in-process memory devices that require a processing step of etching to form a high aspect ratio substrate structure, such as vertical three-dimensional memory devices known as 3D NAND devices.

The substrate can contain one or multiple layers of insulating, conducting, and semi-conducting materials that will be deposited as part of a microelectronic device substrate and then etched in an etching step that uses a hardmask to control the location of the etching. A substrate can include multiple layers of deposited films, sometimes referred to as a "filmstack" that includes deposited layers of one or more silicon-containing materials (silicon nitride, silicon oxide, polysilicon), or other insulating, conducting, semi-conducting, or di-electric materials. As a single example, a useful substrate can be a multi-layer precursor to a 3D NAND memory device. An example device can include many layers of silicon-containing materials that will be etched to form a vertically-extending channel hole having a high aspect ratio. The layers can form a filmstack that includes many (e.g., tens or dozens of) alternating pairs of two different silicon-containing materials. As a specific example, a substrate may include a stack of alternating pairs of deposited film layers, with each pair including one layer of silicon dioxide and one layer of silicon nitride. Such a filmstack can contain any number of such pairs of materials, such as at least 48, 56, or 96 pairs of these two layers, or more.

The hard mask can be useful in a step of etching the substrate (this step is sometimes referred to herein as a "substrate etch" step) to selectively remove material from the substrate and form an opening or space within the substrate from the removed material. The substrate etch step can be performed for the purpose of forming the open structure in the substrate, and many examples of etching methods, etchants, and etching systems and equipment are known for performing these steps. The open structure ("opening") may be any useful structure that is formed in a microelectronic device substrate, e.g., from a film stack of the substrate. In certain example methods, the structure may be a structure that has a high aspect ratio, such as an aspect ratio of at least 20:1, 40:1, or 60:1. Examples of known structures (openings) of these types formed in in-process semiconductor device substrates include channel holes, word line openings, interconnects, and the like.

Features of the methods and various related structures that can occur during practice of the present invention are now described with reference the Figures.

Examples of certain steps of a method of the present description are shown at FIG. 1. This shows a method 10 that includes a step 12 of beginning with a microelectronic device substrate. As one example, the substrate may be an in-process memory device that includes a multi-layer filmstack of multiple discrete layers of deposited materials useful in a microelectronic device. The example filmstack can be one that will be subjected to an etching process to selectively remove material from the layers of the filmstack. Onto a surface of the substrate, in step 14, an amorphous carbon layer is formed.

Figure 2A:
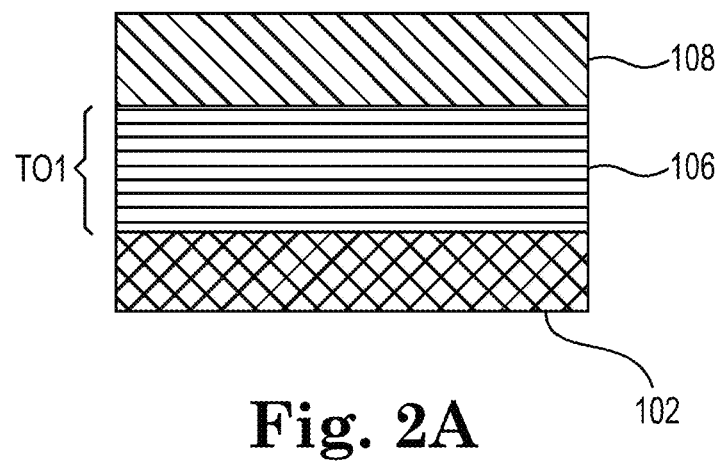
FIGS. 2A through 2E show examples of various microelectronic device substrate structures that are described, and that are present during certain steps of a method of the present description.

Referring to FIG. 2A, illustrated is a schematic depiction of a single example of a microelectronic device substrate that contains multiple pairs of layers of silicon-containing microelectronic device materials, e.g., a filmstack. An early step of a process as described can be a step 14 of forming an amorphous carbon layer at an upper surface of the microelectronic device substrate.

As shown at FIG. 2A, workpiece 100 includes a microelectronic device substrate that includes film stack 104 and support 102. Film stack 104 contains multiple layers 106 of microelectronic materials such as one or more conducting layers, insulating layers, or other types of layers (e.g., etch stop layers). For example, each layer 106 (TO1) can include a pair of a deposited silicon oxide layer and a deposited silicon nitride layer. Film stack 104 can include any useful number of these pairs, such as 24 pairs, 48 pairs, 56 pairs, 96 pairs, etc. At the top or upper surface of film stack 104 is a layer 108 of amorphous carbon.

In more detail with respect to amorphous carbon layer 108, this layer can be a layer that is prepared from amorphous carbon material in a manner to function as a hard mask during a step of etching film stack 104. Generally, an amorphous carbon layer such as layer 108 can be formed by any one of various known methods, such as by one of various methods that are known for depositing a layer of amorphous carbon onto a semiconductor device substrate, including those referred to as "spin-on" techniques and those referred to as "deposition" methods.

Deposition methods include those referred to as chemical vapor deposition methods (CVD), plasma-enhanced chemical vapor deposition methods (PECVD), various types of physical vapor deposition (PVD) techniques, and the like. As just one single example, one useful technique for forming an amorphous carbon layer may is by using a PECVD process with hydrocarbon precursors, such as methane ($CH_4$), propylene ($C_3H_6$), propyne ($C_3H_4$), propane ($C_3H_8$), butane ($C_4H_{10}$), butylenes ($C_4H_8$), butadiene ($C_4H_6$), acetelyne ($C_2H_2$), toluene ($C_7H_8(C_6H_5CH_3)$), and mixtures thereof with a boron source. Other techniques, e.g., "spin-on" techniques, are also known and useful for applying an amorphous carbon layer according to the present description.

The amorphous carbon layer, before a boron-doping step, can contain a useful amount of carbon, such as an amount of carbon that is at least 50, 80, 90, 95 or 99 weight percent carbon. The amorphous carbon layer, before a doping step, can be non-boron-doped, meaning that the amorphous carbon layer preferably contains not more than an insubstantial amount of boron, such as less than 1 weight percent, e.g., less than 0.5, 0.1, or 0.05 weight percent boron. The layer of amorphous carbon, based on the total amount of carbon in the layer, can also contain at least 50 percent by weight of carbon that includes sp1, sp2, and sp3 bonding states, which gives the amorphous carbon properties that are known for an amorphous material, such as a combination of properties that are typical of pyrolylic, graphitic, and diamond-like carbon. Because the amorphous carbon material may contain a plurality of bonding states in various proportions, the carbon material will lack long range order and is considered to be "amorphous."

The amorphous carbon layer may be uniformly placed onto the microelectronic device substrate and can have any thickness that will be useful in performing a desired substrate etching step. Examples of useful thicknesses can be below 10 microns, e.g., from 0.5 to 5 microns, such as from 1 to 3 microns.

Figure 2B:
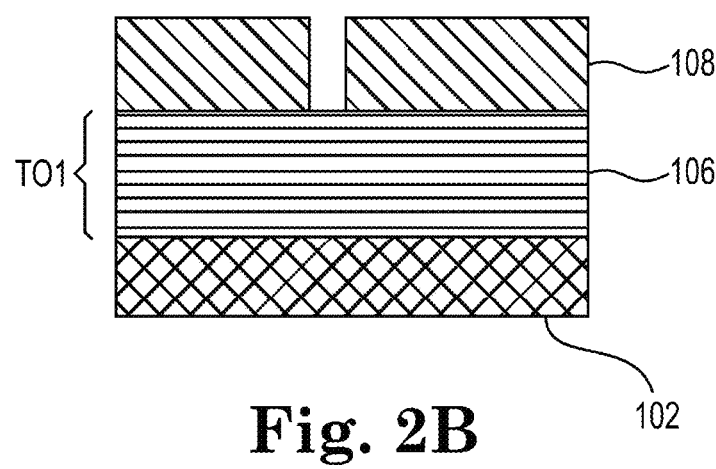

Referring again to FIG. 1, a next step, 16, (step 15 will be discussed below) in a useful method 10 is to form openings in the un-doped amorphous carbon layer by an etching step. This step may sometimes be referred to as a "mask etch" step. Openings formed during the mask etch step are openings selected to allow for subsequent etching of the material of the substrate below the opening, while protecting the material of the substrate that remains covered by amorphous carbon layer 108. Various examples of useful techniques for etching an un-doped amorphous carbon material are known. One example is performed by applying a photolithographic (polymeric) mask over the amorphous carbon layer, forming openings in the photolithographic mask to expose portions of the underlying amorphous carbon layer, and using an oxygen plasma-based dry etching step to form openings in the amorphous carbon layer through the openings of the photolithographic mask. After forming the openings in the amorphous carbon layer, the photolithographic mask is removed. FIG. 2B illustrates a workpiece 100 that includes these features, including opening 110 formed in amorphous carbon layer 108 by the photolithographic masking and etching steps.

As shown at FIG. 1, a next step (step 18) after the mask etch step is a step of doping the etched amorphous carbon layer 108 with boron, i.e., doping amorphous carbon layer 108, which includes opening 110, with boron as a dopant. The doping step is performed using a beamline doping technique, meaning adding boron to the amorphous carbon by bombarding the amorphous carbon layer with a beam of boron ions. Boron doping sources are well known in the art. For example, but not limited to, $BF_3$, enriched $BF_3$, $B_2H_6$, enriched $B_2H_6$, and similar boron dopants known in the art. Other types of doping methods are also known and useful for adding a dopant material such as boron to a layer of amorphous carbon, e.g., plasma immersion methods as well as deposition methods (CVD or PECVD). But those other types of doping methods will produce a boron-doped amorphous carbon layer that includes a substantially uniform amount of boron distributed throughout the entire thickness of the layer; the concentration of boron at the upper portion of the doped amorphous carbon layer is substantially the same as the concentration of boron at the lower portion of the doped amorphous carbon layer. In contrast, as described herein, the use of ion implantation as a method for adding boron to a previously-formed amorphous carbon layer can place a greater concentration of boron at an upper portion of an amorphous carbon layer, and a lower concentration of boron at a lower portion of the amorphous carbon layer.

Because boron can be included selectively at an upper portion of the amorphous carbon layer, the upper portion advantageously exhibits substantially improved etching resistance. At the same time, the lower portion of the amorphous carbon layer, which will remain present at the substrate surface at the end of a substrate etch step and must then be removed, contains a lower concentration of boron and can be more easily removed as compared to a boron-doped amorphous carbon layer that includes a higher concentration of boron.

Figure 2C:
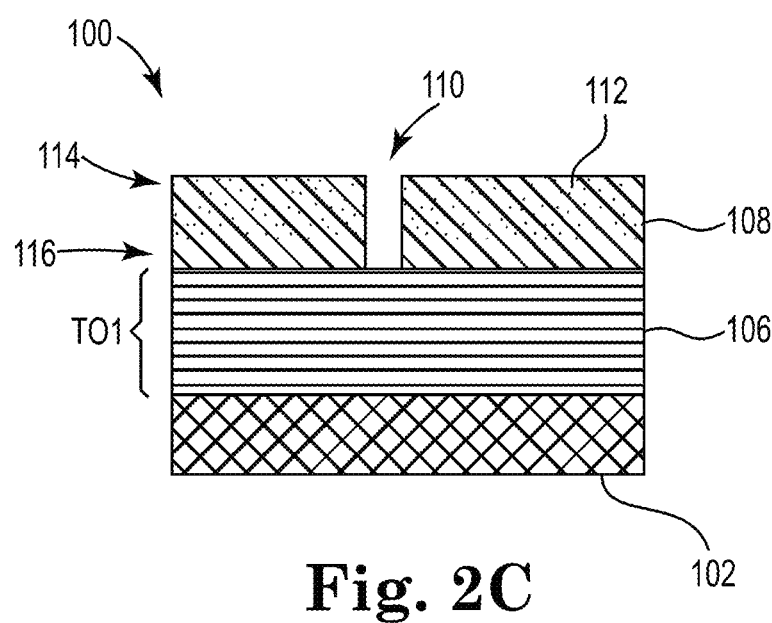

Referring to FIG. 2C, illustrated is workpiece 100 that includes amorphous carbon layer 108 with opening 110, following a step of doping amorphous carbon layer 108 with boron by an ion implantation technique. Boron that has been implanted into amorphous carbon layer 108 is represented by dashed vertical lines 112. As illustrated, upper portion 114 of amorphous carbon layer 108 includes a higher amount, i.e., a higher concentration of the boron than does lower portion 116, which contains a lower amount (concentration) of boron as a dopant.

A boron-doped amorphous carbon layer, e.g., as shown at FIG. 2C, can be prepared by the use of an ion implantation doping technique to contain an amount of boron that will be useful for increasing the chemical resistance of the amorphous carbon layer for use as a hardmask in a substrate etch step. In particular, the upper portion of the amorphous carbon layer can include an amount of boron dopant to cause that portion of the layer to exhibit improved resistant to etchants used in a substrate etch step (relative to a comparable non-boron-doped layer). The lower portion of the amorphous carbon layer need not contain a concentration of boron that is sufficient to increase the resistance of the amorphous carbon material to a chemical etchant, and preferably contains a lower concentration of boron compared to the upper portion of the layer, to facilitate removal of the lower portion of the layer from the substrate following the substrate etch step.

With reference to the entire boron-doped amorphous carbon layer, the total amount of boron can be an amount that, with a higher concentration of boron at the upper portion of the layer, will be effective to provide a desired level of chemical resistance to etchant solution. Examples of useful amounts of boron as a dopant can be an amount in a range from 1 weight percent to about 25 weight percent, e.g., from 2 or 5 weight percent boron to 18 or 20 weight percent boron, based on the total weight of the entire amount of amorphous carbon layer after the doping step. The balance of the material of the boron-doped amorphous carbon layer can be substantially or entirely carbon.

In useful and preferred examples, the boron-doped amorphous carbon layer can comprise, consist of, or consist essentially of carbon and boron, and may contain mostly carbon and boron, e.g., at least 80, 90, 95, or 99 percent by weight of combined amounts of carbon and boron, based on total weight of the amorphous carbon layer after the carbon doping step. A boron-doped amorphous carbon layer that consists essentially of carbon and boron is a layer that contain less than an insubstantial amount of materials other than carbon and boron, e.g., not more than 5, 2, 1, 0.5, 0.1, or 0.05 weight percent of any materials (total) other than carbon and boron. According to the present description, the boron-doped amorphous carbon layer is also annealed. An annealing step involves heating the substrate and the boron-doped amorphous carbon layer, either during or after the doping step, to an elevated temperature in a manner that will affect the amorphous structure of the completed boron-doped carbon hard mask in a way that improves a performance property of the boron-doped amorphous carbon layer as a hardmask. Desirably, annealing the boron-doped amorphous carbon layer can be effective to cause the amorphous structure of the boron-doped amorphous carbon to be physically changed in a way that reduces the number of imperfections in the amorphous structure and improves the resistance of the material to a chemical etchant. An annealing step may improve the strength of an amorphous carbon material and an amorphous carbon layer, and preferably increases the resistance of the amorphous carbon material to chemical materials such as etchants.

A preferred annealing step may be performed during the ion beam boron implantation step by heating the substrate during ion-beam implantation, while boron ions are being added to the amorphous carbon layer by ion implantation.

The timing and temperature of an annealing step can be any that are useful to improve a property of the boron-doped amorphous carbon material. Examples of useful temperatures can be in a range of at least 125 degrees Celsius, up to 400 degrees Celsius, e.g., from 150 to 400 degrees Celsius. The amount of time for the annealing step, meaning the amount of time that the substrate is heated to a temperature within this range, can be any amount of time that will produce a desired annealing effect, such as by use of continuous heating to an annealing temperature for a duration of an ion implantation step, with optional continued heating after the ion implantation step is completed.

A boron-doped amorphous carbon material that is described as "annealed" is one that has been exposed to high temperature as described as part of an annealing step to cause one or more of the effects described of an annealing step such as a change to the amorphous structure of the amorphous carbon material or an improved chemical resistance, e.g., to an etchant.

An ion implantation method can be performed by directing a beam of ions toward a substrate in a perpendicular manner (i.e., in alignment with a central axis of the substrate) or at an angle relative to the central axis. As an example, directing the ion implantation beam toward the substrate at an angle can cause the ions (i.e., boron) to impinge upon the upper surface of the amorphous carbon layer, and onto side surfaces of openings (e.g., opening 110 of FIGS. 2A and 2B) formed in the amorphous carbon layer, while not impinging upon material of the underlying microelectronic device substrate located at the bottom of the openings (e.g., the upper surface of filmstack layer 104 of FIGS. 2B and 2C). A useful angle of an ion implantation beam relative to a substrate may be determined based on the size (e.g., diameter) of openings formed in the amorphous hardmask layer, and based on the thickness of the hardmask layer. Examples of angles of a directed ion beam may be from 1 to 45 degrees, e.g., from 5 to 30 degrees, relative to the central axis of the substrate.

Figure 2D:
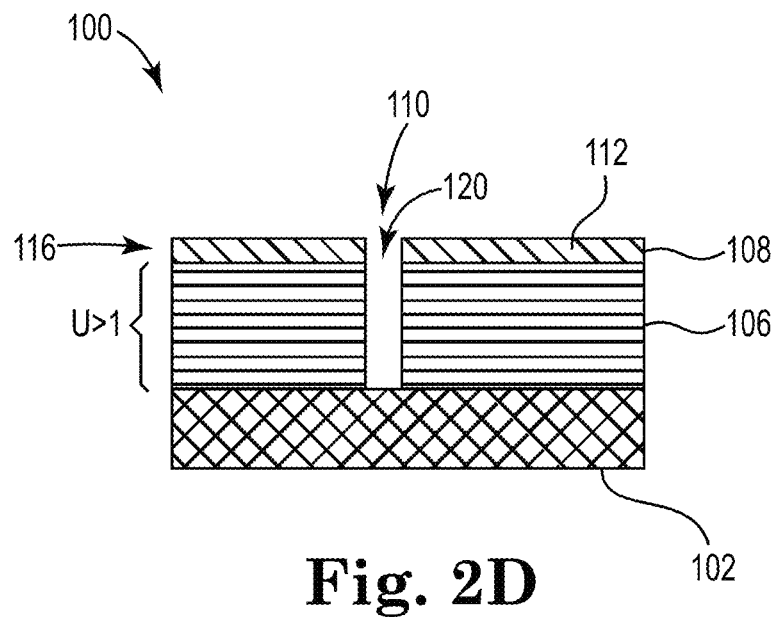

Referring again to FIG. 1, a next step in a useful method, after doping the amorphous carbon hardmask layer, is a step (20) of etching the underlying microelectronic device substrate through the hardmask, sometimes referred to herein as a "substrate etch" step. The substrate etch step is a step of exposing a workpiece that contains a microelectronic device substrate and a boron-doped amorphous carbon hardmask layer that contains etched openings, as described, to a chemical etchant that will chemically remove material of the substrate that is contacted by the etchant through openings in the hardmask. The chemistry of an etchant can be selected based on the type of substrate material being etched, i.e., removed from the substrate. For etching a microelectronic device substrate that includes a filmstack made of silicon-containing materials such as silicon oxide, silicon nitride, polysilicon, etc., known and useful chemical etchant include gaseous materials such as fluorine-based etchants, including etchants that contain one or more gaseous fluorocarbons or perfluorocarbons such as of $CHF_3$, $CF_4$, $CH_3F$, $C_4F_6$, etc. As described elsewhere herein, a boron-doped amorphous carbon hardmask layer of the present description is effective as a hardmask to protect portions of a substrate that are to not be etched during the substrate etching step. Still (as shown at FIG. 2D), an etchant will have an effect of removing some amount of material from the hardmask layer during a step of etching a substrate. Typically, a substantial amount of an upper portion of a hardmask layer will be removed by etchant during a substrate etch step and a lower portion of the original amount (thickness) of the hardmask layer will remain upon completion of the substrate etch step.

A workpiece 100 that has been processed by a substrate etch step is illustrated at FIG. 2D. As shown, workpiece 100 includes filmstack 104, which now includes opening, e.g., "channel hole" 120 extending vertically through the entire depth (thickness) of filmstack 104. Workpiece 100 also includes, on the top of filmstack 104, a remaining lower portion 116 of amorphous carbon layer 108. This remaining lower portion 116 may contain an amount of boron as a dopant, but preferably the amount of boron is less than the amount of boron that is present in upper portion 114 of layer 108 upon completion of an ion implantation step. The amount of boron dopant present in lower portion 116 is also preferably an amount that is sufficiently low that the lower portion 116 can be efficiently and fully removed from filmstack 104 (or another substrate) by a known method commonly used for removing non-boron-doped amorphous carbon hardmask layers, e.g., by a standard oxygen plasma etching step that uses only oxygen as an etchant.

Referring again to FIG. 1, after step 20 that includes forming opening 120 by etching, a remaining portion of amorphous carbon layer 108 must be removed (step 22) from the substrate before additional processing of the microelectronic device substrate can be performed.

Figure 2E:
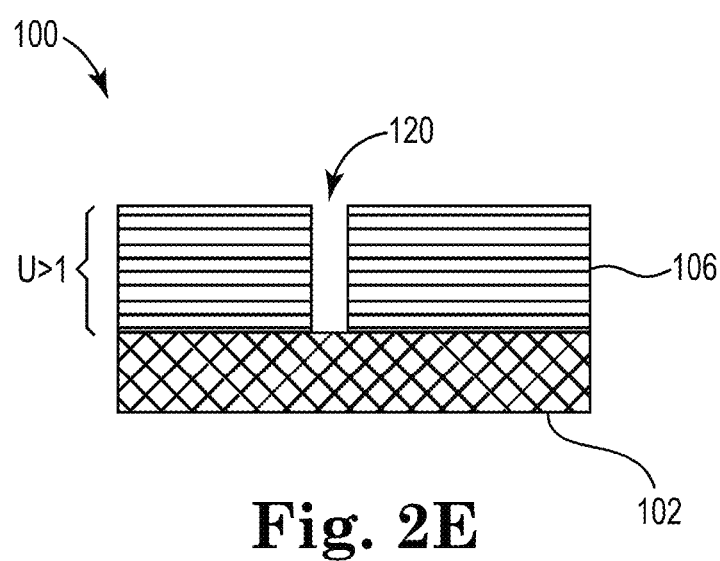
Figure 3A:
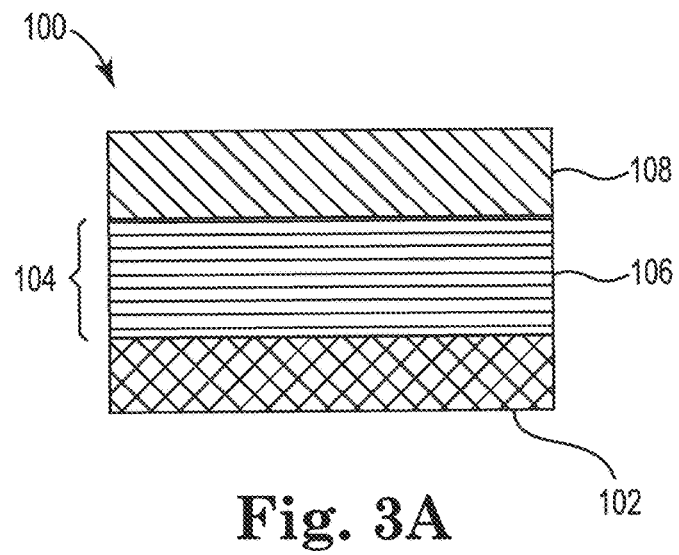
FIGS. 3A and 3C depicts another various microelectronic device substrate that include the optional step of patterning the carbon amorphous layer with a mask prior to etching the layers.
Figure 3B:
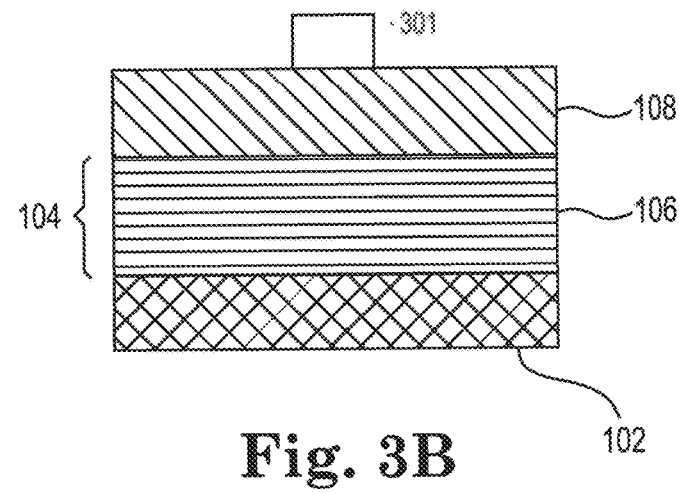
Figure 3C:
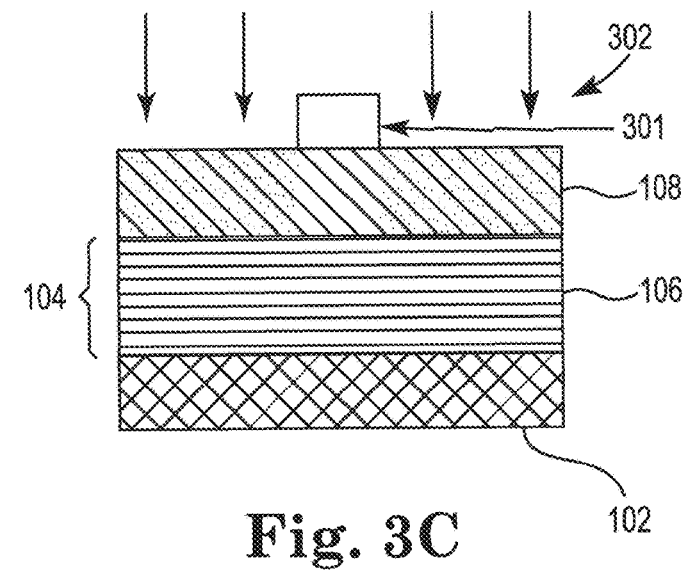

Another method according to the invention is shown with including the optional step 15 from FIG. 1 in which a patterned mask is formed on top of the amorphous carbon layer. This mask can be any carbon mask known in the art. FIG. 3A through 3C shows the first part of the method described in FIG. 1 with the additional step of the patterned mask. FIG. 3A is similar to FIG. 2A as discussed above. FIG. 3B shows a patterned mask on a portion of the carbon amorphous layer. Specifically the patterned mask 301 is on the portion of the carbon amorphous layer that is later etched. Thereafter, in step 3C the patterned mask and the carbon amorphous layer is doped with boron 302 using well known ion implantation methods. The method proceeds to the steps 16-22 depicted in FIGS. 2C-2E.

In certain embodiments of the invention, the boron is doped to have a gradient distribution in the carbon amorphous layer. As such lower portion of an amorphous carbon layer of the present description contains a lower amount of boron as compared to an upper portion of the layer, the lower portion of the amorphous carbon layer does not have a substantially increased resistance to chemical etchants (relative to a non-boron-doped amorphous carbon layer) and is less difficult to remove by an etching step as compared to the more-highly-boron-doped upper portion of a doped amorphous carbon layer of the present description. Desirably, a lower portion of the amorphous carbon layer, which is the remaining portion of the layer following a substrate etch step, can be removed by a standard method often used for the purpose of removing amorphous carbon hardmask material from an in-process microelectronic device substrate.

In other embodiments of the invention, as shown in FIG. 3, the boron is doped is in a conformed method (See 302) throughout the carbon amorphous layer.

In further details of the invention, an example of a standard method is treatment with oxygen plasma, i.e., "oxygen plasma etching." Oxygen plasma etching involves the use of an oxygen source and a plasma system, and does not require any substantial amount of additional chemical etchant other than gaseous oxygen (non-etchant materials such as a buffer can be included). For various reasons, it is know that oxygen plasma etching techniques may sometimes be modified by adding one or more additional chemical etchant materials to oxygen as an etchant, to increase the aggressiveness or etching rate. Examples of such additional chemical etchant materials include fluorine-containing gases such as $CF_4$, $SF_6$, gaseous hydrogen ($H_2$), or a combination of any of these.

Thus, according to preferred examples of the described boron-doped amorphous carbon hardmasks, a preferred hardmask of the present description is one that, after completing a substrate etch step, will be present at a substrate surface as a remaining portion that is capable of being removed from the substrate by a standard oxygen plasma method that includes the use of oxygen as the etchant material, and that does not require any other chemical etchant. Such a step of removing the remaining portion of the amorphous carbon layer can include using one or more other non-etchant materials such as a pH buffer, but does not require and may preferably exclude the presence of any etchant material in addition to oxygen, especially a more aggressive etchant material such as $CF_4$, $SF_6$, or $H_2$; i.e., the remaining lower portion of the hardmask can be removed from the underlying microelectronic device substrate by an oxygen plasma etching step that uses substantially only oxygen as an etchant, meaning that the process uses at least 95, 98, or 99 percent gaseous oxygen (by volume) as an etchant and not more than 1, 2, or 5 percent by volume of any other etchant, e.g., not more than 1, 2, or 5 percent by volume of $CF_4$, $SF_6$, $H_2$, or a combination of two or more of $CF_4$, $SF_6$, and $H_2$.

The invention claimed is:

1. A method of preparing a microelectronic device substrate, the method comprising:
    etching an amorphous carbon hardmask layer of a substrate to form openings in the amorphous carbon hardmask layer, wherein the substrate comprises one or more layers of a microelectronic device and the amorphous carbon hardmask layer at a top surface;
    implanting boron by ion implantation into the amorphous carbon hardmask layer of substrate, wherein a beam of boron ions is directed towards the substrate at an angle relative to a central axis of the substrate; and
    annealing the amorphous carbon hardmask layer.

2. The method of claim 1, wherein the boron-doped amorphous carbon hardmask layer, after annealing, has an increased etch resistance compared to an etch resistance of a comparable boron-doped amorphous carbon hardmask layer that has not been annealed.

3. The method of claim 1, comprising implanting the boron at a relatively higher concentration at an upper portion of a thickness of the amorphous carbon hardmask layer and at a relatively lower concentration at a lower portion of the thickness.

4. The method of claim 1, comprising annealing the amorphous carbon hardmask layer during ion implantation of the boron.

5. The method of claim 1, comprising heating the substrate to a temperature in a range from 150 to 400 degrees Celsius during annealing.

6. The method of claim 1, wherein the amorphous carbon hardmask layer has a thickness in a range from 0.5 to 5 microns.

7. The method of claim 1, comprising etching the amorphous carbon hardmask layer to form openings in the amorphous carbon hardmask layer before implanting the boron by ion implantation.

8. The method of claim 7, comprising etching the substrate through the openings in the hardmask layer to form an opening in the substrate, the opening in the substrate having an aspect ratio of at least 40:1.

9. The method of claim 8, wherein the opening in the substrate is a channel hole.

10. The method of claim 8, wherein the substrate etching step includes exposing material of the substrate to a fluorinated or perfluorinated gaseous etchant.

11. The method of claim 10 comprising, after etching the substrate, removing a remaining portion of the hardmask layer by oxygen plasma etching.

12. The method of claim 1, comprising forming a patterned mask on the carbon amorphous layer; and etching the amorphous carbon hardmask layer to form openings in the amorphous carbon hardmask layer before implanting the boron by ion implantation.

13. The method of claim 1, wherein the substrate comprises a film stack comprising multiple layers of silicon-containing materials.

14. The method of claim 1, wherein the substrate comprises multiple layers of silicon oxide and silicon nitride.

\* \* \* \* \*